United States Patent
Cohen

(10) Patent No.: US 10,488,481 B2
(45) Date of Patent: Nov. 26, 2019

(54) SYSTEMS AND METHODS FOR MULTISLICE MAGETIC RESONANCE FINGERPRINTING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

( * ) Notice: Subject to any disclaimer, the term of this patent is extended or adjusted under 35 U.S.C. 154(b) by 101 days.

(21) Appl. No.: 15/900,910

(22) Filed: Feb. 21, 2018

(65) Prior Publication Data
US 2018/0238983 A1 Aug. 23, 2018

Related U.S. Application Data

(60) Provisional application No. 62/462,160, filed on Feb. 22, 2017.

(51) Int. Cl.
*G01R 33/54* (2006.01)
*G01R 33/483* (2006.01)
*G01R 33/561* (2006.01)

(52) U.S. Cl.
CPC ....... *G01R 33/543* (2013.01); *G01R 33/4835* (2013.01); *G01R 33/5611* (2013.01); *G01R 33/5615* (2013.01)

(58) Field of Classification Search
CPC .............. G01R 33/543; G01R 33/5611; G01R 33/4835; G01R 33/5615
See application file for complete search history.

(56) References Cited

U.S. PATENT DOCUMENTS

| | | | |
|---|---|---|---|
| 2015/0346300 A1* | 12/2015 | Setsompop | G01R 33/4828 324/309 |
| 2016/0349341 A1* | 12/2016 | Cohen | A61B 5/055 |
| 2016/0349342 A1* | 12/2016 | Cohen | G01R 33/543 |
| 2018/0031667 A1* | 2/2018 | Sarracanie | G01R 33/5659 |

\* cited by examiner

*Primary Examiner* — Susan S Lee
(74) *Attorney, Agent, or Firm* — Quarles & Brady LLP

(57) ABSTRACT

Systems and methods for multislice magnetic resonance fingerprinting ("MRF") are provided. Data are acquired from multiple different slices, either simultaneously or sequentially, using a schedule of acquisition parameters that are optimized or otherwise selected for each different slice. Dictionary matching techniques are then used to estimate quantitative parameters from the acquired data. The methods can provide both in-plane and through-plane acceleration without the use of multi-channel radio frequency coils.

23 Claims, 3 Drawing Sheets

SYSTEMS AND METHODS FOR MULTISLICE MAGETIC RESONANCE FINGERPRINTING

CROSS-REFERENCE TO RELATED APPLICATIONS

This application claims the benefit of U.S. Provisional Patent Application Ser. No. 62/462,160, filed on Feb. 22, 2017, and entitled "SYSTEMS AND METHODS FOR MULTISLICE MAGNETIC RESONANCE FINGERPRINTING," which is herein incorporated by reference in its entirety.

BACKGROUND

In traditional simultaneous multislice ("SMS") magnetic resonance imaging ("MRI"), the signals from the multiple excited slices are untangled by using the different coil sensitivities of a multi-channel RF coil. The scan time acceleration achieved depends on the number of coil channels available, among other factors. Increasing the number of coil channels leads to challenging design and construction problems. Thus, scan time accelerations of about 2-4 fold are typical with specialized hardware (e.g., 32 channel coils), but the resulting data is qualitative rather than quantitative. Additionally, acceleration in the slice direction comes at the cost of reduced in-plane acceleration. If a short echo time ("TE") acquisition is desired, the maximum acceleration factor is greatly reduced.

Therefore, there remains a need for a method that permits in-plane acceleration without adversely affecting slice acceleration and without requiring specialized coils.

SUMMARY OF THE DISCLOSURE

The present disclosure addresses the aforementioned drawbacks by providing a magnetic resonance imaging ("MRI") system and method for estimating quantitative parameters of a subject. The method includes selecting for each of a plurality of different slices, a schedule of acquisition parameters. Each schedule of acquisition parameters is selected to direct an MRI system to generate a plurality of different signal evolutions that maximize discrimination between different quantitative parameters in a minimized number of repetition time ("TR") periods. Data are acquired with the MRI system by directing the MRI system to perform a plurality of pulse sequences using the selected schedules of acquisition parameters. Each of the plurality of pulse sequences implements radio frequency ("RF") excitation of the plurality of different slices in each TR period. The acquired data represent the plurality of different signal evolutions that maximize discrimination between different quantitative parameters. Quantitative parameters of the subject are then estimated by comparing the acquired data with a dictionary database comprising a plurality of different signal templates.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
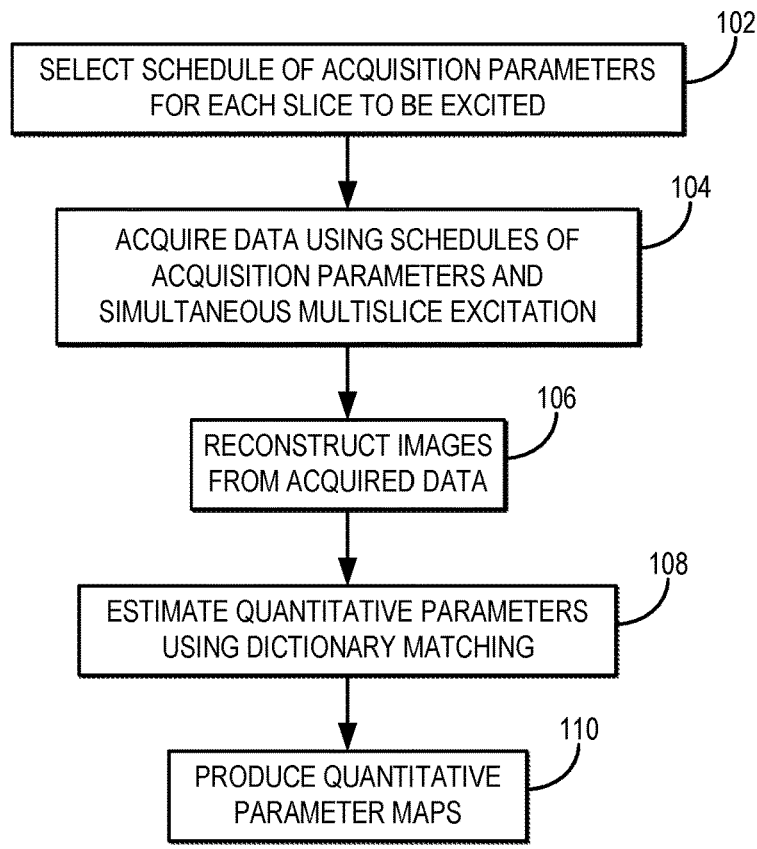
FIG. 1 is a flowchart setting forth the steps of a non-limiting example of a method for implementing multislice magnetic resonance fingerprinting using a simultaneous multislice excitation.

Described here are systems and methods for multislice magnetic resonance fingerprinting ("MRF"), in which data are acquired from multiple different slices, either simultaneously or sequentially, using a schedule of acquisition parameters that are optimized or otherwise selected for each different slice.

The systems and methods described in the present disclosure allow for quantitative tissue mapping using simultaneous multislice ("SMS") imaging without the need for multi-channel RF coils. When used with multi-channel RF coils, however, the systems and methods described in the present disclosure allow for additional in-plane acceleration (e.g., short TEs) without adversely affecting the acceleration in the slice direction. Alternatively, the systems and methods described in the present disclosure can be used to decrease the acquisition scan time by an order of magnitude or more.

Advantageously, the slice acceleration provided by the systems and methods described in the present disclosure can reduce specific absorption rate ("SAR") and are less $B_1$ insensitive than traditional SMS techniques.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. The acquisition parameters can be varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

MRF can be conceptualized as employing a series of varied "sub-blocks" that simultaneously produce different signal evolutions in different "resonant species" to which the RF is applied. The term "resonant species," as used herein, refers to a material, such as water, fat, bone, muscle, soft tissue, and the like, that can be made to resonate using nuclear magnetic resonance ("NMR"). By way of illustration, when RF energy is applied to a volume that has both bone and muscle tissue, then both the bone and muscle tissue will produce a magnetic resonance signal. However the "bone signal" represents a first resonant species and the "muscle signal" represents a second resonant species and thus the two signals will be different. These different signals from different resonant species can be collected simultaneously over a period of time to collect an overall "signal evolution" for the volume.

As stated above, in general, the measurements obtained in MRF techniques achieve spatial incoherence, temporal incoherence, or both, by varying the acquisition parameters from one TR period to the next, which creates a time series of signals with varying contrast. From these measurements, MRF processes can be designed to map any of a wide variety of parameters, such as longitudinal relaxation time, $T_1$; transverse relaxation time, $T_2$; main or static magnetic field, $B_0$; and proton density, $\rho$. MRF is generally described in U.S. Pat. No. 8,723,518 and Published U.S. Patent Application No. 2015/0301141, each of which is incorporated herein by reference in its entirety.

The data acquired with MRF techniques is compared with a dictionary of signal models, or templates, that have been generated for different acquisition parameters from magnetic resonance signal models, such as Bloch equation-based physics simulations. This comparison allows for the estimation of physical parameters, such as those mentioned above. In general, the parameters for the tissue or other material in a given voxel are estimated to be the values that provide the best signal template matching.

As one none-limiting example, the comparison of the acquired signals to a dictionary can be performed using any suitable matching or pattern recognition technique. In general, the comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

Instead of using a single schedule (e.g., a single schedule of FAs and TRs) to excite each slice individually, the systems and methods described in the present disclosure excite multiple slices either simultaneously or sequentially, but with a different acquisition schedule for each slice.

Referring now to FIG. 1, a flowchart is illustrated as setting forth the steps of one non-limiting example of a method for multislice MRF using a simultaneous excitation of multiple different slices.

The method includes generating a vector, trajectory, or schedule, of acquisition parameters that has been optimized or otherwise selected to sufficiently sample a quantitative parameter space, as indicated at step 102. In some instances, the schedule of acquisition parameters is selected or otherwise optimized to reduce the number of acquisitions necessary while still providing for sufficient sampling of the quantitative parameter space. For an SMS acquisition, the acquisition parameters can include FA, TR, and frequency offset of the RF excitation pulse or pulses used to implement the simultaneous excitation of multiple different slice locations. In general, a different schedule of acquisition parameters is optimized or otherwise selected for each different slice to be excited.

By modifying the frequency offset of the component RF excitation pulses, different slices can be excited. To excite multiple slices simultaneously, the RF pulses can be added together. In addition to varying the frequency offset of each component RF pulse, the FAs can be varied as well. It should be noted that one of the limiting factors in traditional SMS is the limits on the maximum $B_1$ that can be generated by the MRI system hardware.

Figure 2:
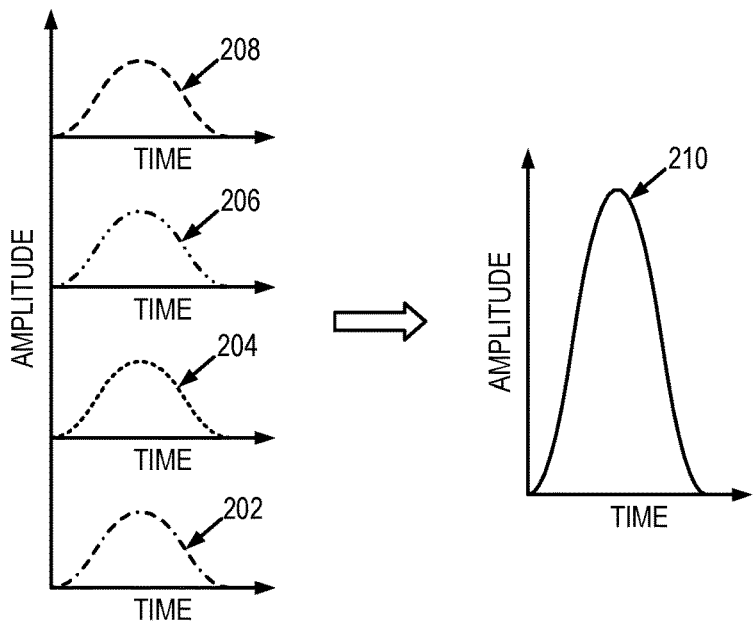
FIG. 2 illustrates an example of a multiband radio frequency ("RF") pulse and its associated component RF pulses, which each have different frequency offsets, which can be implemented for simultaneous excitation of multiple different slices.

An example of a simultaneous multislice RF excitation scheme is shown in FIG. 2. In this example, a multiband RF pulse composed of four different component RF pulses (one for each of four different slices to be excited) is illustrated. The component RF pulses 202, 204, 206, and 208 are designed to affect the spins in each of four different slices. For example, the frequency content of each of the component RF pulses 202, 204, 206, and 208 is selected to match the Larmor frequency of a spin species as it is modified in each of four desired slice locations by a slice-selection gradient to be applied during an imaging study. The cumulative effect of generating these component RF pulses 202, 204, 206, and 208 at the same time is to generate a multiband RF pulse 210 with an amplitude approximately equal to the sum of the amplitudes of the component RF pulses 202, 204, 206, and 208. Because the component RF pulses 202, 204, 206, and 208 share the same temporal footprint, the increased power required by the multiband RF pulse 210 is deposited to the RF coil and the subject during this same duration of time.

With the techniques described in the present disclosure, the acquisition parameter schedule for each slice can be optimized to ensure that the maximum $B_1$ isn't exceeded, even for multiple slices. Because each slice is excited with a different schedule, their signal evolution is unique.

In one non-limiting example, the selection or optimization of acquisition parameters, such as FA, TR, and frequency offset may include providing an initial seed vector of the acquisition parameter to be selected or optimized. In some instances, the initial seed vector can be randomly or pseudorandomly generated. The seed vector may have a length, N, and can be used to simulate the signal for a range, P, of quantitative parameters. The seed vector and simulated quantitative parameters are used to form an N×P matrix, A. This matrix, A, can then be used to calculate a dot product matrix, $$D = A^T A \quad (1).$$

The diagonal elements of this dot product matrix, D, indicate the closeness of a match between a trajectory resulting from a given quantitative parameter (e.g., $T_1$) and itself. The diagonal elements are, therefore, equal to one. The off-diagonal elements of the dot product matrix, D, however, indicate the quality of matching between every two different elements of the matrix, A. Discriminating between quantitative parameter values in the matching process is based on the dot product of a measured trajectory with the pre-computed trajectory that is stored in the dictionary being high for the correct quantitative parameter value and, ideally, zero for all others. To find the vector of acquisition parameters (e.g., TRs and FAs) that yield this optimum, or a value that is otherwise sufficiently desirable, a model can be utilized. One non-limiting example of such a model is the following optimization problem:

$$\min_x f(x) \text{ such that } \sum_{i \neq j} D_{ij}(x) - \lambda \sum_{i=j} D_{ij}(x); \quad (2)$$

Where $f(x)$ is the function to simulate the trajectories and compute the dot product matrix, D, given a vector, x, of acquisition parameters. A penalty term, λ, is applied as well to avoid minimizing the on-diagonal elements. Another non-limiting example of a model is:

$$\min_x f(x) = \frac{\sum_{i \neq j} D_{ij}(x)}{\sum_{i=j} D_{ij}(x)}; \quad (3)$$

where the ratio of off-diagonal to diagonal elements is minimized. As one example, a constrained non-linear solver can be used to solve Eqns. (2) and (3).

After the schedule of acquisition parameters for each slice has been optimized or otherwise selected, data are acquired by directing an MRI system to perform pulse sequences using the schedules of acquisition parameters, as indicated at step 104. The pulse sequences can be any suitable pulse sequence for obtaining magnetic resonance fingerprinting data, but in some embodiments the pulse sequence used can be an echo-planar imaging ("EPI") pulse sequence that implement a multiband RF pulse for simultaneous excitation of multiple different slices. In some other embodiments, the pulse sequence can implement controlled aliasing in parallel imaging results in higher acceleration ("CAIPIRINHA") imaging techniques, such as blipped CAIPIRINHA. Data can be acquired using single channel or multi-channel RF coils.

Although the techniques described in the present disclosure do not require multi-channel RF coils for implementation, the techniques can provide additional advantages to the use of multi-channel RF coils. For instance, a multi-channel RF coil can be used to provide significant in-plane undersampling of k-space, while the computational MRF techniques described in the present disclosure can be used to provide acceleration along the slice dimension. Alternatively, traditional SMS can be used to acquire multiple thick slice blocks and the techniques described in the present disclosure can be used to resolve the N thinner slices within each block, effectively multiplying the acceleration factor of the traditional SMS method by a factor N.

Images are then reconstructed from the acquired data, as indicated at step 106. Quantitative parameters are then estimated by, for example, matching the reconstructed images to one or more pre-computed dictionaries, as indicated at step 108. The data acquired from multiple different simultaneously excited slices correspond to voxels that each contain contributions from all of the excited slices. Reconstructing images from this data using a conventional dictionary would be computationally intensive because, assuming a simultaneous excitation of N slices, each voxel must be matched to N different sets of tissue parameter values. As a result, the dictionary size would be $P^N$, where P is the number of different tissue parameter (e.g., $T_1$, $T_2$, $B_0$, ρ) values in the dictionary. Because a typical dictionary can contain P=200,000 entries, even an N=2 can significantly increase the computation burden of the dictionary matching process. Thus, while conventional matching algorithms can be used, in some configurations, an adaptive matching algorithm, such as the one described in co-pending U.S. Patent Application Ser. No. 62/025,268 and PCT Application No. PCT/US15/11948, which are herein incorporated by reference in their entirety, can also be used. Using an adaptive dictionary mapping, the signal in each voxel is calculated assuming N spins excited with N different schedules, and the tissue parameters space is searched for the values that yield the greatest fidelity to the acquired data. The N sets of tissue parameter values are then assigned to their respective slices. In some other embodiments, a neural network can be trained and used to estimate quantitative parameters. As one example, signal vectors can be matched using a sparsely sampled dictionary to train a neural network, which allows for simultaneously quantifying multiple different tissue parameters maps in a fraction of the computational time required by conventional MRF techniques. An example of such a technique is described in co-pending U.S. patent application Ser. No. 15/872,449, which is herein incorporated by reference in its entirety. Parameter maps can then be generated using the estimated quantitative parameters, as indicated at step 110.

Figure 3:
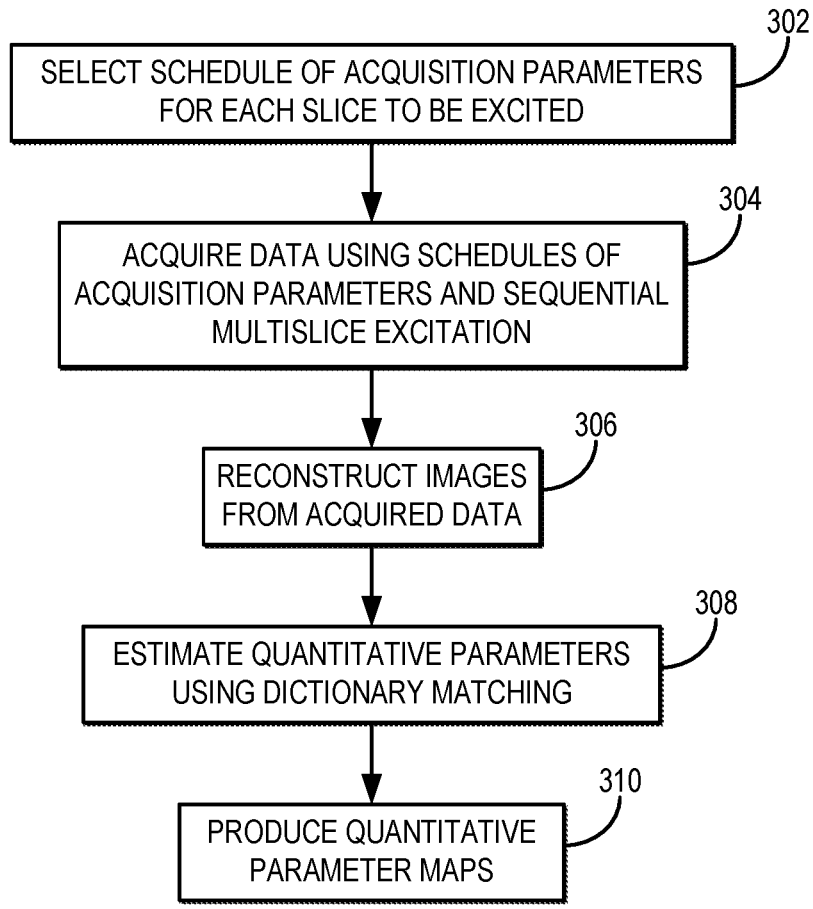
FIG. 3 is a flowchart setting forth the steps of a non-limiting example of a method for implementing multislice magnetic resonance fingerprinting using a sequential excitation of multiple different slices.

Referring now to FIG. 3, a flowchart is illustrated as setting forth the steps of one non-limiting example of a method for multislice MRF using a sequential excitation of multiple different slices. One advantage of using a sequential excitation rather than a simultaneous excitation of the slices is that with a sequential excitation no special optimization is required to ensure that the maximum $B_1$ isn't exceeded. However, unlike in the simultaneous excitation described above, in a sequential excitation each slice experiences a different echo time ("TE") depending on its temporal proximity to the readout period. These different TEs can be modeled by the reconstruction process and can be used to provide additional discrimination by permuting the order of the slices excited from measurement to measurement to yield more accurate tissue parameter maps.

Like the method described above, the method implementing a sequential excitation of different slices includes generating a vector, trajectory, or schedule, of acquisition parameters that has been optimized or otherwise selected to sufficiently sample a quantitative parameter space, as indicated at step 302. In some instances, the schedule of acquisition parameters is selected or otherwise optimized to reduce the number of acquisitions necessary while still providing for sufficient sampling of the quantitative parameter space. The acquisition parameters can include FA, TR, TE, and frequency offset of the RF excitation pulses used to implement the sequential excitation of multiple different slice locations. In general, a different schedule of acquisition parameters is optimized or otherwise selected for each different slice to be excited. In some non-limiting examples, the schedules of acquisition parameters can be optimized or otherwise selected as described above.

Figure 4:
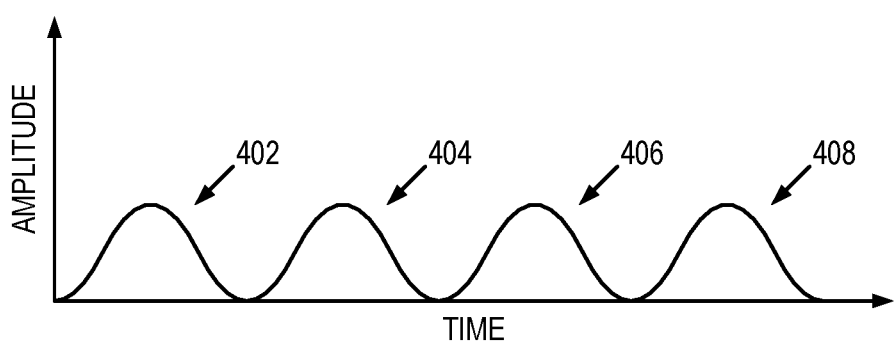
FIG. 4 illustrates an example of a multiple RF excitation pulses, which each have different frequency offsets, and which are applied sequentially in time to implement sequential excitation of multiple different slices.

An example of an RF excitation scheme that implements a sequential excitation of multiple different slices is shown in FIG. 4. In this example, four different RF excitation pulses (one for each of four different slices to be excited) is illustrated. The RF excitation pulses 402, 404, 406, and 408 are designed to affect the spins in each of four different slices. For example, the frequency content of each of the RF excitation pulses 402, 404, 406, and 408 is selected to match the Larmor frequency of a spin species as it is modified in each of four desired slice locations by a slice-selection gradient to be applied during an imaging study. Because, unlike the simultaneous excitation scheme described above, the RF excitation pulses 402, 404, 406, and 408 do not share the same temporal footprint, the sequential excitation has less power deposition as compared to a simultaneous excitation with component RF pulses of the same amplitude.

After the schedule of acquisition parameters for each slice has been optimized or otherwise selected, data are acquired by directing an MRI system to perform pulse sequences using the schedules of acquisition parameters, as indicated at step 304. The pulse sequences can be any suitable pulse sequence for obtaining magnetic resonance fingerprinting data, but in some embodiments the pulse sequence used can be an echo-planar imaging ("EPI") pulse sequence that implement sequentially applied RF pulses (e.g., temporally adjacent RF excitation pulses) for sequential excitation of multiple different slices. As described above, data can be acquired using single channel or multi-channel RF coils as desired.

Images are then reconstructed from the acquired data, as indicated at step 306. Quantitative parameters are then estimated by, for example, matching the reconstructed images to one or more pre-computed dictionaries, as indicated at step 308. As described above, while conventional matching algorithms can be used, in some configurations, an adaptive matching algorithm can also be used. Using an adaptive dictionary mapping, the signal in each voxel is calculated assuming N spins excited with N different schedules, and the tissue parameters space is searched for the values that yield the greatest fidelity to the acquired data. The N tissue parameter values are then assigned to their respective slices. Parameter maps can then be generated using the estimated quantitative parameters, as indicated at step 310.

Figure 5:
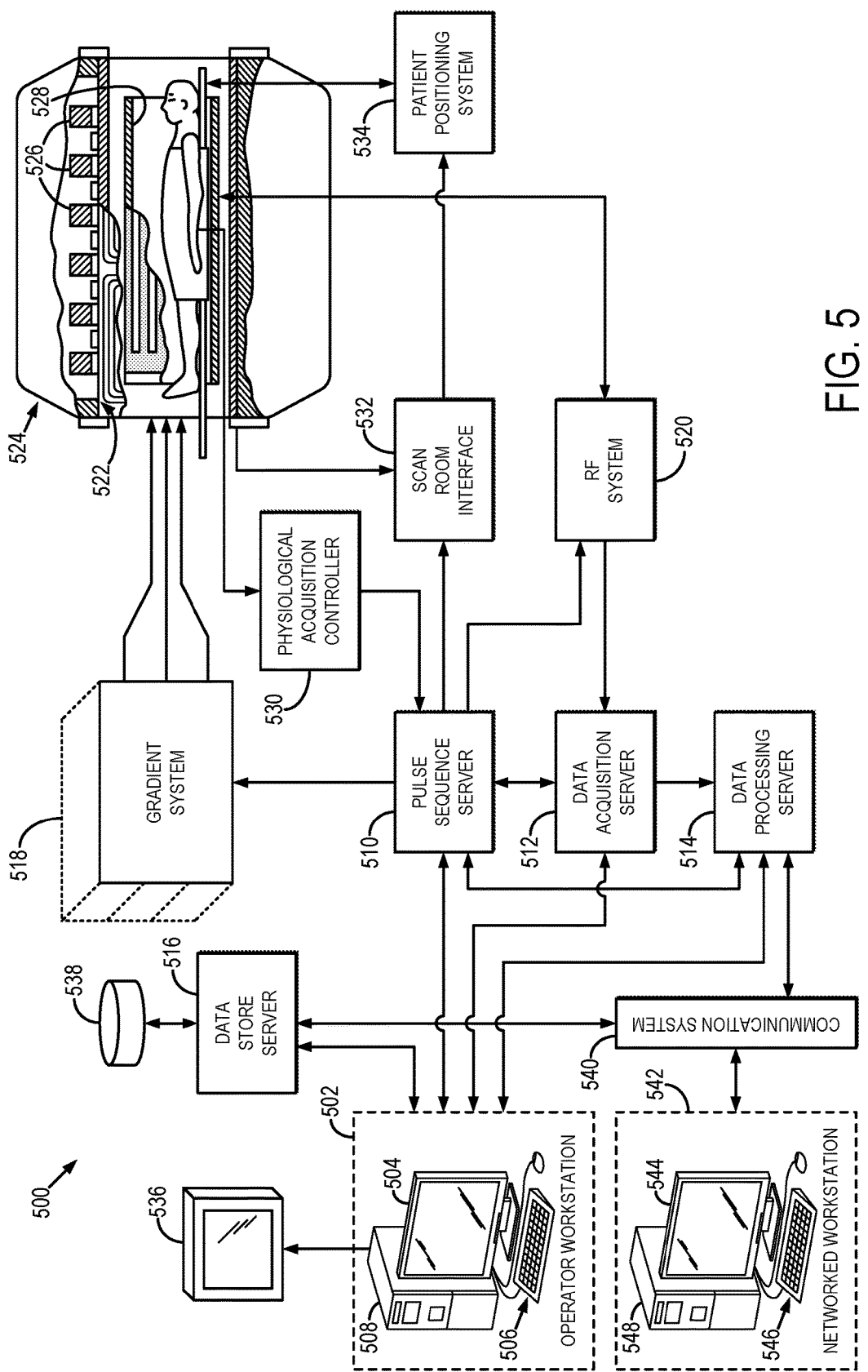
FIG. 5 is a block diagram of an example of a magnetic resonance imaging system that can implement the methods described in the present disclosure.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (4);$$

and the phase of the received magnetic resonance signal may also be determined according to the following relationship:

$$\varphi = \tan^{-1}\left(\frac{Q}{I}\right). \qquad (5)$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present disclosure has described one or more preferred embodiments, and it should be appreciated that many equivalents, alternatives, variations, and modifications, aside from those expressly stated, are possible and within the scope of the invention.

The invention claimed is:

1. A method for estimating quantitative parameters of a subject using a magnetic resonance imaging (MRI) system, the steps of the method comprising:
   (a) selecting for each of a plurality of different slices, a schedule of acquisition parameters wherein each schedule of acquisition parameters is selected to direct an MRI system to generate a plurality of different signal evolutions that maximize discrimination between different quantitative parameters in a minimized number of repetition time (TR) periods;
   (b) acquiring data with the MRI system by directing the MRI system to perform a plurality of pulse sequences using the selected schedules of acquisition parameters, wherein each of the plurality of pulse sequences implements radio frequency (RF) excitation of the plurality of different slices in each TR period, and wherein the acquired data represent the plurality of different signal evolutions that maximize discrimination between different quantitative parameters; and
   (c) estimating quantitative parameters of the subject by comparing the acquired data with a dictionary database comprising a plurality of different signal templates.

2. The method as recited in claim 1, wherein each of the plurality of pulse sequences implements RF excitation of the plurality of different slices in each TR period using a simultaneous RF excitation in which each of the plurality of slices is excited simultaneously.

3. The method as recited in claim 2, wherein the RF excitation includes applying a multiband RF pulse comprising a plurality of component RF pulses, and wherein each of the plurality of component RF pulses has a frequency offset associated with one of the plurality of different slices.

4. The method as recited in claim 3, wherein each schedule of acquisition parameters includes a schedule of flip angles, TRs, and frequency offsets.

5. The method as recited in claim 1, wherein the data are acquired in step (b) using a multi-channel RF coil.

6. The method as recited in claim 5, wherein each of the plurality of pulse sequences implements an undersampling of k-space in a plane of k-space that is orthogonal to a slice encoding direction.

7. The method as recited in claim 1, wherein the data are acquired in step (b) using a single channel RF coil.

8. The method as recited in claim 1, wherein each of the plurality of pulse sequences implements RF excitation of the plurality of different slices in each TR period using RF excitation pulses that are applied sequentially in time.

9. The method as recited in claim 8, wherein each of the RF excitation pulses applied in a given TR period has a different frequency offset associated with one of the plurality of different slices.

10. The method as recited in claim 9, wherein each schedule of acquisition parameters includes a schedule of flip angles, TRs, and frequency offsets.

11. The method as recited in claim 10, wherein each schedule of acquisition parameters also include a schedule of echo times.

12. The method as recited in claim 1, wherein selecting the schedules of acquisition parameters includes estimating the acquisition parameters by minimizing an objective function that simulates the acquisition parameters and computes a matrix that is based on estimated values of the acquisition parameters and the quantitative parameters to be estimated.

13. A magnetic resonance imaging (MRI) system, comprising:
   a magnet system configured to generate a polarizing magnetic field;
   a magnetic gradient system including a plurality of magnetic gradient coils configured to apply at least one magnetic gradient field to the polarizing magnetic field;
   a radio frequency (RF) system configured to apply an RF field to a subject arranged in the polarizing magnetic field and to receive magnetic resonance signals from the subject using an RF coil;
   a computer system programmed to:
      select for each of a plurality of different slices, a schedule of acquisition parameters wherein each schedule of acquisition parameters is selected to direct an MRI system to generate a plurality of different signal evolutions that maximize discrimination between different quantitative parameters in a minimized number of repetition time (TR) periods;
      direct the gradient system and the RF system to acquire data by performing a plurality of pulse sequences using the selected schedules of acquisition parameters, wherein each of the plurality of pulse sequences implements RF excitation of the plurality of different slices in each TR period, and wherein the acquired data represent the plurality of different signal evolutions that maximize discrimination between different quantitative parameters; and estimate quantitative parameters of the subject by comparing the acquired data with a dictionary database comprising a plurality of different signal templates.

14. The MRI system as recited in claim 13, wherein each of the plurality of pulse sequences implements RF excitation of the plurality of different slices in each TR period using a simultaneous RF excitation in which each of the plurality of slices is excited simultaneously.

15. The MRI system as recited in claim 14, wherein the RF excitation includes directing the RF system to apply a multiband RF pulse comprising a plurality of component RF pulses, and wherein each of the plurality of component RF pulses has a frequency offset associated with one of the plurality of different slices.

16. The MRI system as recited in claim 15, wherein each schedule of acquisition parameters includes a schedule of flip angles, TRs, and frequency offsets.

17. The MRI system as recited in claim 13, wherein the RF coil is a multi-channel RF coil.

18. The MRI system as recited in claim 17, wherein each of the plurality of pulse sequences implements an undersampling of k-space in a plane of k-space that is orthogonal to a slice encoding direction.

19. The MRI system as recited in claim 13, wherein the RF coil is a single channel RF coil.

20. The MRI system as recited in claim 13, wherein each of the plurality of pulse sequences implements RF excitation of the plurality of different slices in each TR period using RF excitation pulses that are applied sequentially in time by the RF system.

21. The MRI system as recited in claim 20, wherein each of the RF excitation pulses applied in a given TR period has a different frequency offset associated with one of the plurality of different slices.

22. The MRI system as recited in claim 21, wherein each schedule of acquisition parameters includes a schedule of flip angles, TRs, and frequency offsets.

23. The MRI system as recited in claim 22, wherein each schedule of acquisition parameters also include a schedule of echo times.

* * * * *